United States Patent [19]

Jones et al.

[11] 4,020,460
[45] Apr. 26, 1977

[54] METHOD AND APPARATUS OF CHECKING TO DETERMINE IF A SIGNAL IS PRESENT ON MORE THAN ONE OF N LINES

[75] Inventors: Julius Dwight Jones, Wappingers Falls; Dale Milton Junod, Highland, both of N.Y.

[73] Assignee: IBM Corporation, Armonk, N.Y.

[22] Filed: Nov. 13, 1975

[21] Appl. No.: 631,767

[52] U.S. Cl. ............... 340/146.1 AB; 235/153 AE; 340/146.1 BE

[51] Int. Cl.² ................... G06F 11/00; H03K 13/32

[58] Field of Search ........ 340/146.1 AB, 146.1 BE; 235/153 AE

[56] References Cited

UNITED STATES PATENTS

| | | | |
|---|---|---|---|
| 2,973,506 | 2/1961 | Newby | 340/146.1 AB |
| 3,541,507 | 11/1970 | Duke | 340/146.1 AB |
| 3,559,167 | 1/1971 | Carter et al. | 340/146.1 AB |
| 3,585,637 | 6/1971 | Jones et al. | 340/146.1 AB |
| 3,638,184 | 1/1972 | Beuscher et al. | 340/146.1 AB |
| 3,891,143 | 6/1975 | Haeusler | 235/153 AE |

OTHER PUBLICATIONS

Sellers et al., Error Detecting Logic for Digital Computers, McGraw-Hill Book Co., 1968, pp. 176, 177, 207–218.

Primary Examiner—Charles E. Atkinson
Attorney, Agent, or Firm—James E. Murray

[57] ABSTRACT

This specification describes an apparatus for determining if more than one of $n$ lines are up at a given time. The apparatus includes means for encoding the $n$ lines into $m$ lines where $n = 2^m$. Two encoding signals are generated; one, $X_0 X_1 \ldots X_m$, complement of the other, $Z_0 Z_1 \ldots Z_m$. These two signals are Ex OR'd in accordance with the formula $(X_0 \forall Z_0) \cdot (X_1 \forall Z_1) \ldots (X_m \forall Z_m)$. If more than one line is up, the resultant of the Ex OR operation is one. Otherwise the resultant is zero.

4 Claims, 5 Drawing Figures

METHOD AND APPARATUS OF CHECKING TO DETERMINE IF A SIGNAL IS PRESENT ON MORE THAN ONE OF N LINES

BACKGROUND OF THE INVENTION

The present invention relates to error checking and more particularly to determining whether more than one line is up.

A common problem in computers is to select one out of $n$ lines for a transmission of a signal thereon. The selection process usually compares a signal indicating each of the lines to an incoming signal and if the system is operating properly a match will occur on one and only one of the lines. However, at times errors will occur and more than one line will be selected. When this happens data will be misdirected and errors will occur.

A typical situation is the transmission of data to a memory. The outputs of the $n$ lines are passed through an encoder to generate a signal of $n$ bits where $n = 2^m$. If two lines are up of course the encoder is going to give an erroneous signal on the $m$ lines to the decoder of the memory and data will either be placed in or removed from the wrong position in the memory. A number of schemes have been generated to determine whether more than one line is up. Most of these schemes require significant amounts of apparatus to implement and therefore it is desirable to produce a scheme that will check the propriety of the output signal of the encoder with a minimum of circuitry.

THE INVENTION

Therefore in accordance with the present invention a new method and apparatus is provided to determine if more than one of $n$ lines is up at any given time. The apparatus includes generating two encoding signals; one, $X_0 X_1 \ldots X_m$, the complement of the other, $Z_0 Z_1 \ldots Z_m$. These two signals are Exclusive Or'ed together in accordance with the formula: $(X_0 \forall Z_0) \cdot (Z_1 \forall Z_1) \ldots (X_m \forall Z_m)$. If the output of the Ex OR circuit is one, no more than one line is up; if the output of the Ex OR circuit is zero, more than one line is up.

Therefore it is an object of the present invention to provide a new method and apparatus to determine if more than one of $n$ lines is up.

Another object of the invention is to determine if only one of $n$ lines is up.

Another object of the present invention is to determine whether one and only one of $n$ lines is up with a minimum of circuitry.

THE DRAWINGS

These and other objects and features of the invention can be understood from the following description of the drawings of which:

PREFERRED EMBODIMENT OF THE INVENTION

Figure 1:
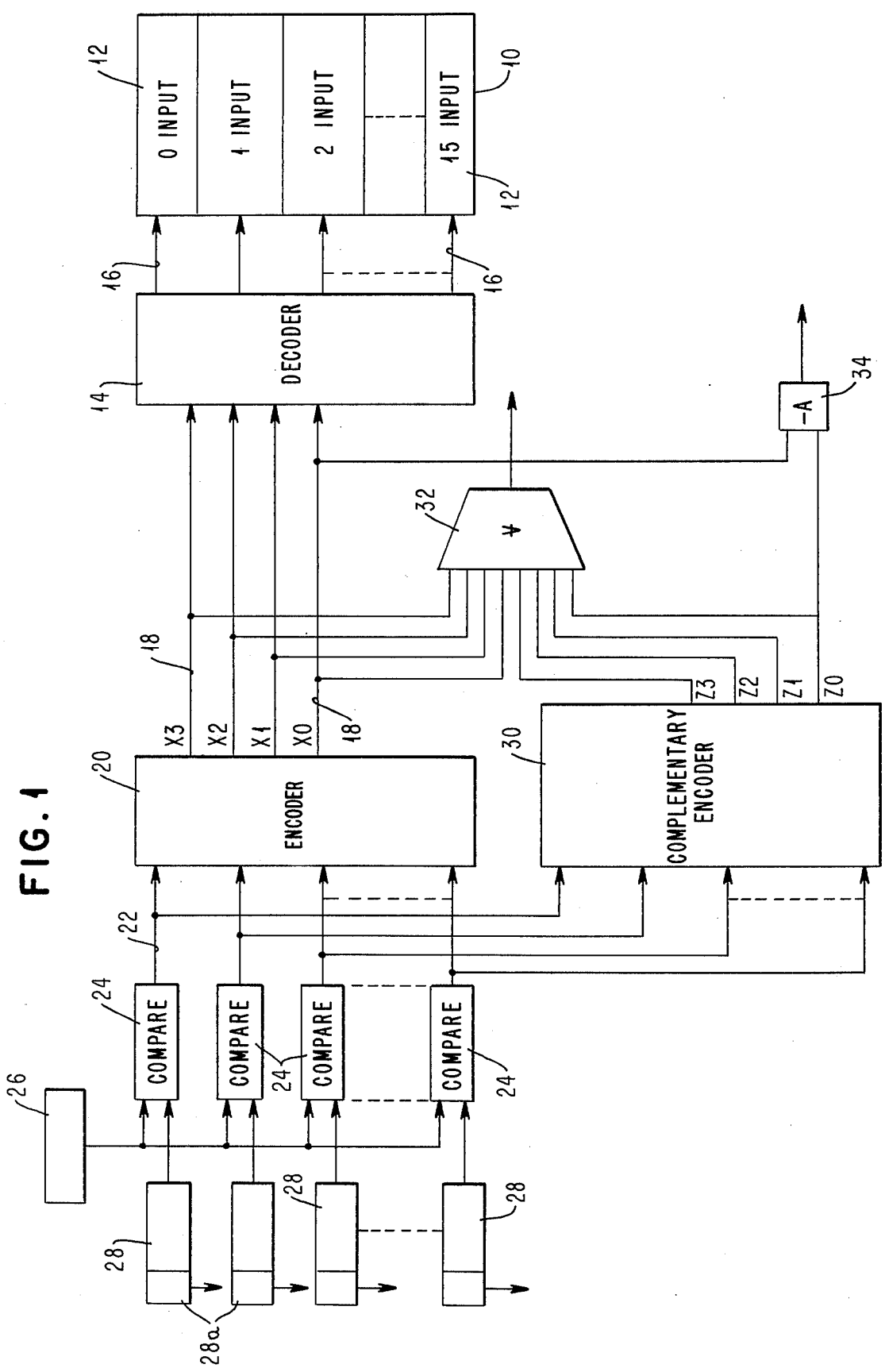
FIG. 1 is addressing circuitry for a memory incorporating the present invention.

Referring now to FIG. 1 a memory 10 is divided into 16 segments 12. Segment selection is through decoder 14 which takes an encoded four bit address for the segment and decodes it to one of 16 addressing lines 16. The encoded signal comes from the output lines 18 of an encoder 20. The encoder takes the information on 16 input lines 22 and encodes them into a four digit message, $X_0 X_1 X_2 X_3$. The information supplied to the encoder 22 is determined by the results of compare operations in comparators 24. The comparators 24 compare the accessing address in register 26 with the preselected address of each of the segments stored in the registers 28. If the system is working properly, the address in register 26 will match one and only one of the segment addresses stored in registers 28 resulting in a compare on one of the lines. This will result in a binary one on that line and binary zeroes on the 15 other output lines 22.

The encoder 20 takes this information and turns it into a four digit address $X_0$, $X_1$, $X_2$, $X_3$ which is unique for each combination of input signals where one and only one of the inputs is up. The encoded signal so produced is fed to the decoder 14 resulting in the selection of the present segment 12. However, if by accident a compare is indicated in more than one comparator 24 meaning two or more of the lines are up, the output of the encoder 20 will give an erroneous address selecting the wrong segment 12 in the memory 10. To guard against this a number of schemes have been devised to check that one and only one of the lines 22 is up at a given time. However, as the number of lines, $n$, increases the apparatus needed to monitor them becomes unwieldy and expensive. Therefore in accordance with the present invention, a new checking method and apparatus to determine if more than one line is up has been devised.

The new method and apparatus includes a complementary encoder 30 which produces the complement of the output of the encoder 20. This complementary 30 produces a four digit address $Z_0 Z_1 Z_2 Z_3$ which is the complement of the address $X_0 X_1 X_2 X_3$ for any situation where one and only one input is up and which again is unique for each combination of input signals where one and only one of the inputs is up. The following chart is a list of all possible encoder output combinations:

| | | Encoder 20 | | | | | Encoder 30 | | | |
|---|---|---|---|---|---|---|---|---|---|---|
| | | $X_0$ | $X_1$ | $X_2$ | $X_3$ | | $Z_0$ | $Z_1$ | $Z_2$ | $Z_3$ |
| Input | 0 | 0 | 0 | 0 | 0 | | 1 | 1 | 1 | 1 |
| | 1 | 0 | 0 | 0 | 1 | | 1 | 1 | 1 | 0 |
| | 2 | 0 | 0 | 1 | 0 | | 1 | 1 | 0 | 1 |
| | 3 | 0 | 0 | 1 | 1 | | 1 | 1 | 0 | 0 |
| | 4 | 0 | 1 | 0 | 0 | | 1 | 0 | 1 | 1 |
| | 5 | 0 | 1 | 0 | 1 | | 1 | 0 | 1 | 0 |
| | 6 | 0 | 1 | 1 | 0 | | 1 | 0 | 0 | 1 |
| | 7 | 0 | 1 | 1 | 1 | | 1 | 0 | 0 | 0 |
| | 8 | 1 | 0 | 0 | 0 | | 0 | 1 | 1 | 1 |
| | 9 | 1 | 0 | 0 | 1 | | 0 | 1 | 1 | 0 |
| | 10 | 1 | 0 | 1 | 0 | | 0 | 1 | 0 | 1 |
| | 11 | 1 | 0 | 1 | 1 | | 0 | 1 | 0 | 0 |
| | 12 | 1 | 1 | 0 | 0 | | 0 | 0 | 1 | 1 |
| | 13 | 1 | 1 | 0 | 1 | | 0 | 0 | 1 | 0 |
| | 14 | 1 | 1 | 1 | 0 | | 0 | 0 | 0 | 1 |
| | 15 | 1 | 1 | 1 | 1 | | 0 | 0 | 0 | 0 |

The first matrix describes the signals that would appear on the lines of encoder 20 while the second matrix indicates the signal that would appear on the output of complementary encoder 30. These signals are Ex Or'ed in the Ex ORing circuitry 32 in accordance with the following formula: $(X_0 \veebar Z_0) \cdot (X_1 \veebar Z_1) \cdot (X_2 \veebar Z_2) \ldots (X_m \veebar Z_m) = 1$. If one and only one of the signals are up, the Ex OR circuitry will have an up output or a binary one at its output. If more than one signal is up, the output will be zero. This is because the vectors described in the matrices are orthogonal to one another. For a given input, all linear combinations of the vectors, except if no lines are present or only one line is present, produces two vectors that are non-orthogonal to one another. Thus when the output of the encoders are non-orthogonal to one another, more than one line is up. For example, if only input line 14 is on:

$$X_0 = 1, X_1 = 1, X_2 = 1, X_3 = 0$$

$$Z_0 = 0, Z_1 = 0, Z_2 = 0, Z_3 = 1$$

$$(X_0 \veebar Z_0) \cdot (X_1 \veebar Z_1) \cdot (X_2 \veebar Z_2) \cdot (X_3 \veebar Z_3) = 1$$

If two lines are on, for example, lines 3 and 5:

$$X_0 = 0, X_1 = 1, X_2 = 1, X_3 = 1$$

$$Z_0 = 1, Z_1 = 1, Z_2 = 1, Z_3 = 0$$

$$(X_0 \veebar Z_0) \cdot (X_1 \veebar Z_1) \cdot (X_2 \veebar Z_2) \cdot (X_3 \veebar Z_3) = 0$$

More generally speaking when only one input line is on, the output for either the $i^{th}$ and $j^{th}$ input is unique. To see this, let $X_{ij}$ and $Z_{ij}$ be the normal $j^{th}$ bit outputs for both decoders when only the $i^{th}$ line is on. When Q lines are on:

| Encoder No. 1 | Encoder No. 2 |
|---|---|
| $X_0 = X_{00} + X_{10} + \ldots + X_{Q0}$ | $Z_0 = Z_{00} + Z_{10} + \ldots + Z_{Q0}$, where $Z_{ij} = X_{ij}$ |
| $X_1 = X_{01} + X_{11} + \ldots + X_{Q1}$ | $Z_1 = Z_{01} + Z_{11} + \ldots + Z_{Q1}$, for $0 \leq i \leq Q$ |
| $X_2 = X_{01} + X_{11} + \ldots + X_{Q2}$ | $Z_2 = Z_{01} + Z_{12} + \ldots + Z_{Q2}$, $0 \leq j \leq M$ |
| \| \| \| \| | \| \| \| \| |
| \| \| \| \| | \| \| \| \| |
| \| \| \| \| | \| \| \| \| |
| $X_M = X_{0M} + X_{1M} + \ldots + X_{QM}$ | $Z_N = Z_{0N} + Z_{1N} + \ldots + Z_{QN}$ |

Case I, $Q = 1$ when only one line is on then:

$$(X_0, X_1, X_2, \ldots, X_M) = (\bar{Z}_0, \bar{Z}_1, \bar{Z}_2, \ldots, \bar{Z}_M)$$

Case II, $Q > 1$ when more than one line is on:

$$(X_0, X_1, X_2, \ldots, X_M) \neq (\bar{Z}_0, \bar{Z}_1, \bar{Z}_2, \ldots, \bar{Z}_M)$$

Case III, $Q = 0$ when no lines are on:

$$(X_0, X_1, X_2, \ldots, X_M) \neq (\bar{Z}_0, \bar{Z}_1, \bar{Z}_2, \ldots, \bar{Z}_M)$$

since:

$$X_0, X_1, X_2, \ldots, X_M = Z_0, Z_1, Z_2, \ldots, Z_M = (0, 0, \ldots 0)$$

As can be seen, only one error condition is not covered and that is if none of the lines go up when the system is addressed. To cover this the low order digits $Z_0$ and $X_0$ are put into a negative AND circuit 34. If the output of this circuit is a one, then the system is operating properly. However, if it is a zero then the system is improperly operating in that no lines were up. This should be apparent from the charts.

Figure 2:
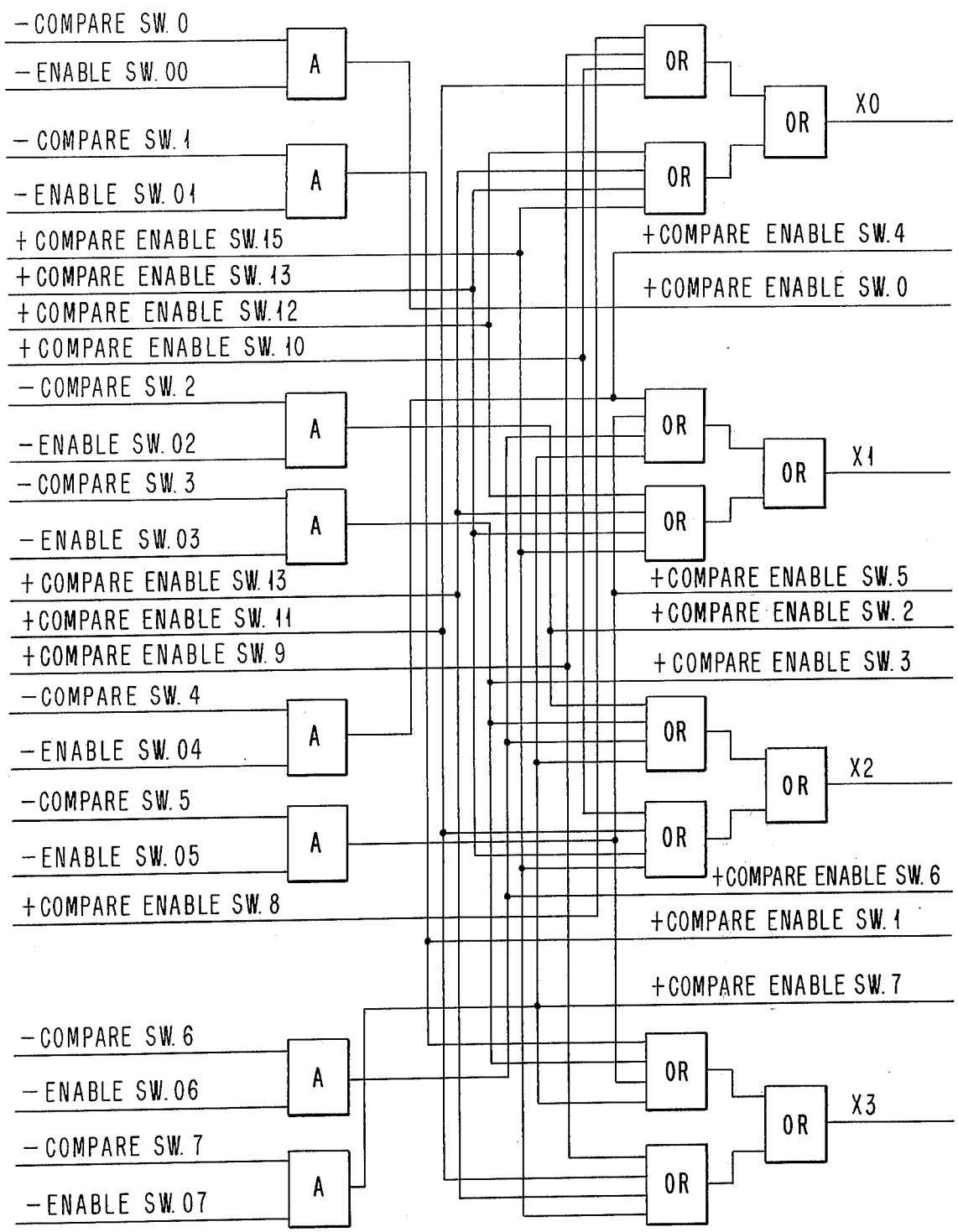
FIG. 2 is circuitry for the encoder shown in FIG. 1.
Figure 3:
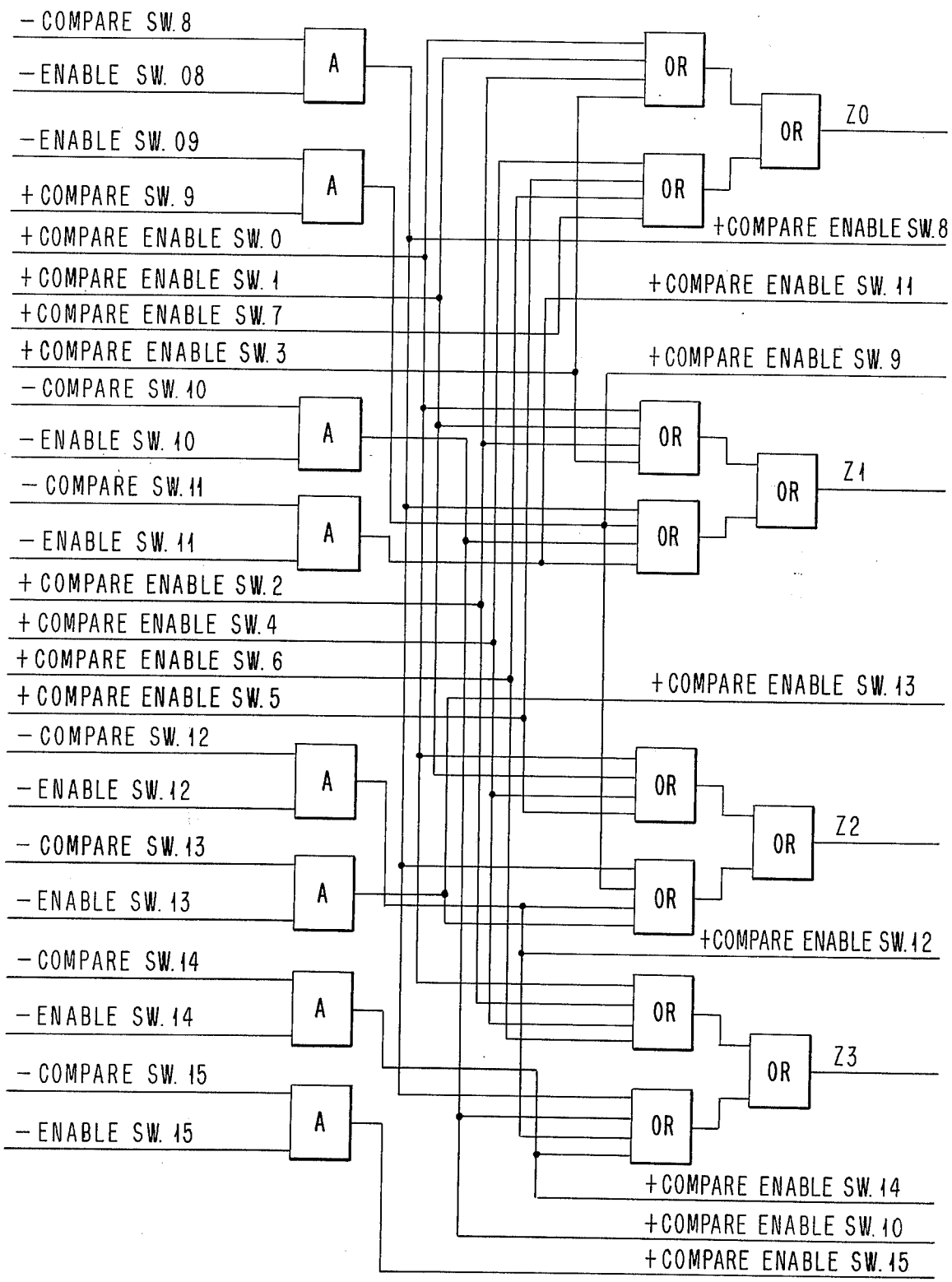
FIG. 3 is circuitry for the complementary encoder shown in FIG. 2.
Figure 4:
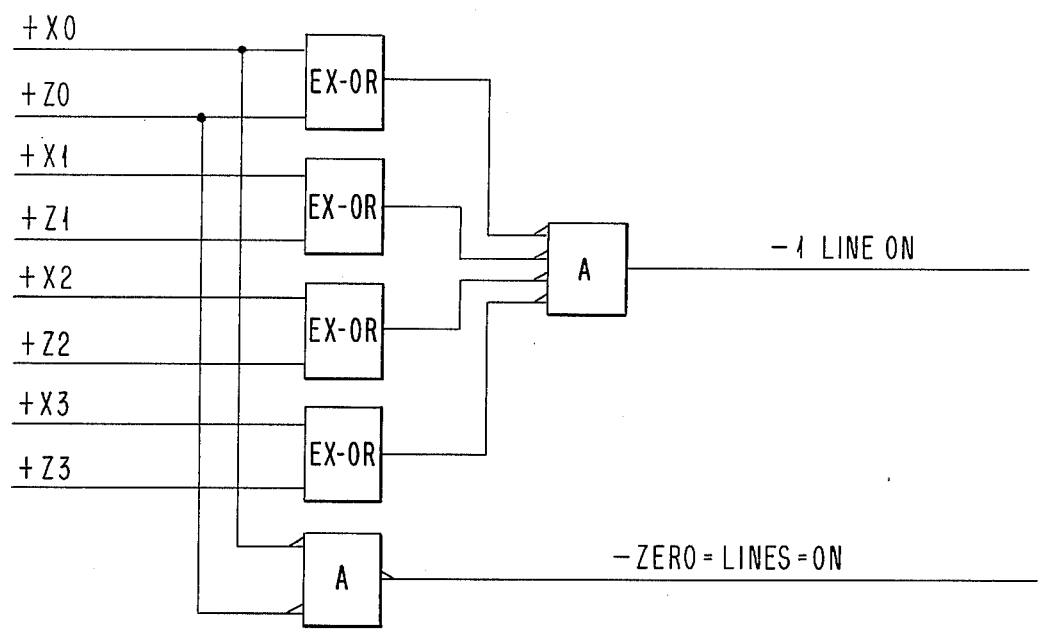
FIG. 4 is the circuitry for the Ex OR circuit of FIG. 1.
Figure 5:
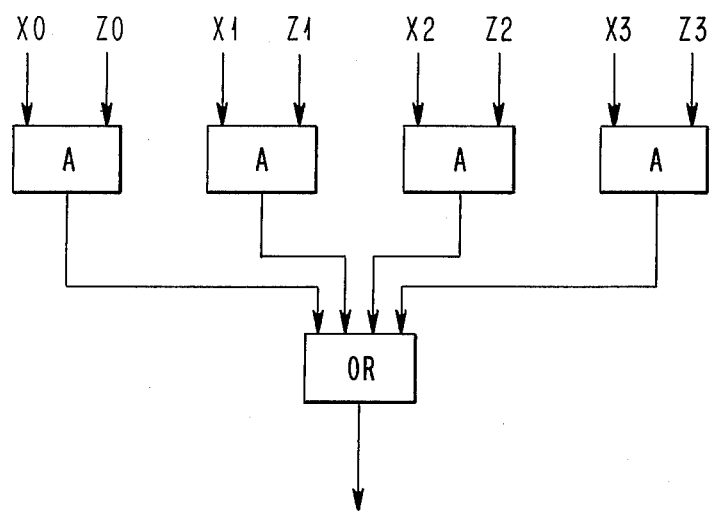
FIG. 5 is an alternative form of the Ex OR circuit of FIG. 1.

The encoder 20 in FIG. 1 is shown in FIG. 2. The complementary encoder is shown in FIG. 3. The enable switch inputs to these decoders 20 and 30 are the output of an additional stage 28a of the register 28. This stage is used to assure that the output of the decoders are properly set. The Ex OR circuitry is shown in FIG. 4. However this circuitry may be simplified because only the $(X_0 Z_0) + (X_1 Z_1) + (X_2 Z_2) + (X_3 Z_3)$ portions of the Ex OR function is needed to make the necessary determination. This simplified form of the decoder 32 is shown in FIG. 5. If the output of the decoder is up or true then more than one line is on.

Therefore, while the invention has been particularly shown and described with reference to a preferred embodiment thereof, it will be understood by those skilled in the art that the above and other changes in form and details may be made therein without departing from the spirit and scope of the invention.

What is claimed is:
1. A method for determining whether more than one of $n$ lines are up comprising the steps of:
   encoding the $n$ lines into $m$ digits where $n = 2^m$ in two complementary sets, $X_0, X_1, \ldots X_m$ and $Z_0, Z_1, \ldots Z_m$,
   comparing the two sets together in accordance with the following formula: $(X_0 \veebar Z_0) \cdot (X_1 \veebar Z_1) \ldots \cdot (X_m \veebar Z_m)$; and,
   determining if the resultant of comparison is a binary one or a binary zero to indicate whether more than one line is up.
2. The method of claim 1 comparing the low order digits $X_0$ and $Z_0$ to see if they are different to determine if no lines are up.
3. Apparatus for determining whether a signal is present on more than one of $n$ lines comprising:
   encoding means coupled to the $n$ lines for generating two orthogonal decoding signals of $m$ digits, $X_0, X_1, \ldots X_m$ and $Z_0, Z_1 \ldots Z_m$ where $n = 2^m$;
   comparison means coupled to the output of the encoding means for performing the following comparison:
   $(X_0 \veebar Z_0) \cdot (X_1 \veebar Z_1) \ldots (X_m \veebar Z_m)$; and,
   means coupled to the output of the comparison means for indicating whether the output of the comparison circuit is a binary one or a binary zero.
4. The apparatus of claim 3 including:
   means coupled to the output of the comparison means for determining whether the low order digits $X_0$ and $Z_0$ are the same or different to find if none of the lines are up.

* * * * *